(12) United States Patent
Lee

(10) Patent No.: US 6,586,332 B1
(45) Date of Patent: Jul. 1, 2003

(54) DEEP SUBMICRON SILICIDE BLOCKING

(75) Inventor: Ming-Yi Lee, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/981,154

(22) Filed: Oct. 16, 2001

(51) Int. Cl.$^7$ ............................................... H01L 21/44
(52) U.S. Cl. ..................... 438/656; 438/655; 438/303; 438/304; 438/305; 438/306; 438/307
(58) Field of Search ................................. 438/656, 299, 438/303, 655, 657, 663, 664, 301, 307, 302, 304, 305, 306

(56) References Cited

U.S. PATENT DOCUMENTS

| | | | |
|---|---|---|---|
| 4,724,193 A | * | 2/1988 | Yamazaki |
| 4,804,606 A | * | 2/1989 | Ohno et al. |
| 4,980,736 A | * | 12/1990 | Takasaki et al. |
| 5,115,123 A | * | 5/1992 | Hayashi et al. |
| 5,399,415 A | * | 3/1995 | Chen et al. |
| 5,935,875 A | * | 8/1999 | Lee |
| 6,025,267 A | * | 2/2000 | Pey et al. |
| 6,258,648 B1 | * | 7/2001 | Lee |
| 6,277,683 B1 | * | 8/2001 | Pradeep et al. |
| 6,348,389 B1 | * | 2/2002 | Chou et al. |

* cited by examiner

Primary Examiner—Long Pham
(74) Attorney, Agent, or Firm—Luedeka, Neely & Graham

(57) ABSTRACT

A method for blocking formation of a reacted metal layer on a structure in an integrated circuit. The integrated circuit has a source region, a drain region, a gate, an isolation area formed of a material, and a protective layer formed of substantially the same material as the isolation area. The protective layer overlies at least the source region and the drain region. The method is accomplished while reducing an amount of the material of the isolation area that is removed when the material of the protective layer is removed. A blocking layer is deposited on the integrated circuit. The blocking layer is formed of a material that is substantially different from the material of the isolation area and the protective layer. The blocking layer is patterned to selectively cover portions of the blocking layers that overlie at least the structure and selectively expose portions of the blocking layer that overlie at least the source region, the drain region, and the gate. The exposed portions of the blocking layer are etched with an etchant to substantially remove the exposed portions of the blocking layer, and to expose portions of the protective layer. The etchant etches the blocking layer at a substantially greater rate than the protective layer. The exposed portions of the protective layer are etched for a period of time that is just sufficient to remove the exposed portions of the protective layer, but not sufficient to substantially remove any of the material of the isolation area. Portions of the integrated circuit are thereby exposed, including at least the source region, the drain region, and the gate. Metal is deposited on the exposed portions of the integrated circuit. The metal is reacted with at least the source region, the drain region, and the gate to form the reacted metal layer, and unreacted metal is removed from other exposed portions of the integrated circuit and the blocking layer.

15 Claims, 2 Drawing Sheets

DEEP SUBMICRON SILICIDE BLOCKING

FIELD

This invention relates to the field of integrated circuit processing. More particularly, this invention relates to a method for blocking silicide formation on structures such as island resistors in deep submicron integrated circuits.

BACKGROUND

There is continual pressure for integrated circuits to be increasingly faster and increasingly more powerful. Both of these objectives tend to be influenced by the size of the integrated circuits. By fabricating smaller integrated circuits, electrical pathways are shorter and more devices are formed within a given space, which tends to result in a faster, more powerful integrated circuit.

However, as integrated circuits become smaller, the devices within integrated circuits also become smaller. As lateral integrated circuit device geometries continue to shrink, it often is desirable to commensurately shrink certain vertical geometries of the integrated circuits as well. As the various layers and structures also become thinner, it tends to become increasingly important to control the formation of the layers and structures, because there tends to be less tolerance to variation in the thickness of a relatively thinner structure than in the thickness of a relatively thicker structure.

When fabricating integrated circuits such as complimentary metal oxide semiconductor devices, it is typically desirable to form the source and the drain regions with shallow junction depths in the substrate. The junction depths for a deep submicron device are typically less than about one thousand angstroms. However, there are other design goals that compete with the design goal of forming source and drain regions with shallow junction depths. For example, silicide blocking polysilicon and island resistors, called block resistors herein, are typically formed on the substrate to perform functions such as impedance matching, data conversion, and bias functions.

In order to form silicide block resistors on a substrate, material such as oxide is deposited on the surface of the substrate and then selectively removed. Those areas in which the oxide is removed are exposed to a metal deposition and silicided, and those areas in which the oxide remains are not silicided. During the removal of the oxide blocking material, other structures or devices on the substrate such as trench isolation areas also tend to have material removed. Removal of the oxide from the trench isolation areas typically creates additional recesses, which tend to cause increased junction leakage current.

Thus, there is a need for a process for forming silicide block resistors in a substrate, where any material removed from the isolation areas is reduced.

SUMMARY

The above and other needs are met by a method for blocking formation of a reacted metal layer on a structure in an integrated circuit. The integrated circuit has a source region, a drain region, a gate, an isolation area formed of a material, and a protective layer formed of substantially the same material as the isolation area. The protective layer overlies at least the source region and the drain region. The method is accomplished while reducing an amount of the material of the isolation area that is removed when the material of the protective layer is removed.

A blocking layer is deposited on the integrated circuit. The blocking layer is formed of a material that is substantially different from the material of the isolation area and the protective layer. The blocking layer is patterned to selectively cover portions of the blocking layers that overlie at least the structure and selectively expose portions of the blocking layer that overlie at least the source region, the drain region, and the gate. The exposed portions of the blocking layer are etched with an etchant to substantially remove the exposed portions of the blocking layer, and to expose portions of the protective layer. The etchant etches the blocking layer at a substantially greater rate than the protective layer.

The exposed portions of the protective layer are etched for a period of time that is just sufficient to remove the exposed portions of the protective layer, but not sufficient to substantially remove any of the material of the isolation area. Portions of the integrated circuit are thereby exposed, including at least the source region, the drain region, and the gate. Metal is deposited on the exposed portions of the integrated circuit. The metal is reacted with at least the source region, the drain region, and the gate to form the reacted metal layer, and unreacted metal is removed from other exposed portions of the integrated circuit and the blocking layer.

Thus, by forming the blocking layer of a material that is substantially different from the material of the protective layer and the isolation structure, the thickness of the blocking layer can be removed without etching the material of the protective. Then when the protective layer is removed, a thinner layer of material is removed, which provides for a greater degree of control of over etching of the protective layer. In this manner, the amount of material that is removed from the isolation structures is preferably reduced. By protecting the isolation areas from over etching and thereby reducing removal of material from the isolation areas, the shallow junction source and drain regions may be fully silicided without a substantial increase in leakage current.

In various preferred embodiments of the invention, the substrate is silicon and the protective layer is silicon oxide. The blocking layer is preferably deposited by plasma enhanced chemical vapor deposition using an alkyl silane base precursor. In a preferred embodiment, the blocking layer is amorphous silicon carbide and the step of patterning the blocking layer further comprises depositing a photoresist layer and a bottom antireflection coating, exposing the photoresist layer, and developing the photoresist layer. In an alternate embodiment, the blocking layer is amorphous silicon oxy carbide and the step of patterning the blocking layer further comprises depositing a photoresist layer, exposing the photoresist layer, and developing the photoresist layer, wherein the blocking layer serves as an antireflection coating layer. In a preferred embodiment, the etching process of the protective layer comprises a wet etch using hydrofluoric acid. The etching process of the blocking layer preferably comprises a plasma etch.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
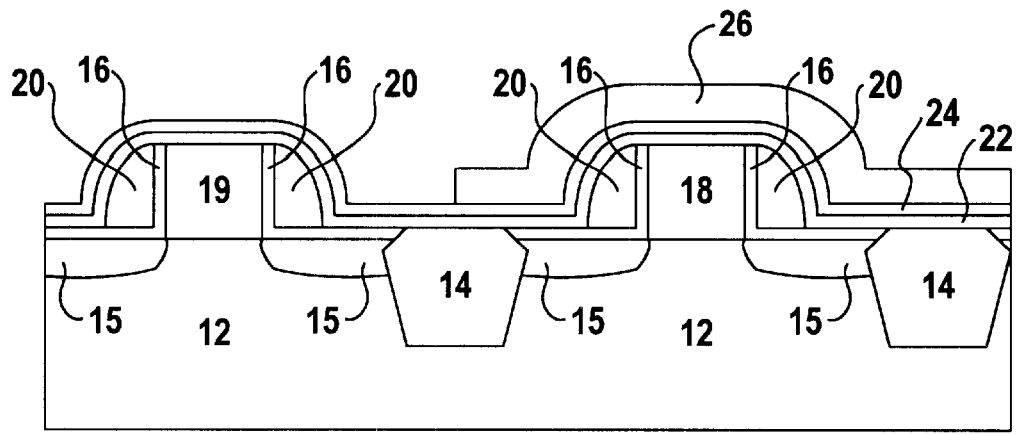
FIG. 1 is a cross sectional side view of an integrated circuit formed in a substrate.

Referring now to FIG. 1, there are depicted portions of an integrated circuit 10. Although applicable to broader range of devices, the embodiments of the present invention are described herein with reference to deep submicron complimentary metal oxide semiconductor devices. In FIG. 1 there is depicted a cross sectional view of a substrate 12 in which the integrated circuit 10 is formed. The substrate 12 is preferably a silicon substrate, but may alternately be formed of other semiconducting materials, such as germanium or a III-V compound such as gallium arsenide, or a combination of these materials.

The substrate 12 as depicted in FIG. 1 is at a point in the processing where several structures have already been formed on the substrate 12. For example, the integrated circuit 10 preferably has source and drain regions 15 formed in the substrate 12. The source and drain regions 15 of the preferred embodiment form junctions having a depth of less than about one thousand angstroms. Although the present invention is applicable to integrated circuits 10 having other junction depths, the benefits of the present invention are particularly desirable for integrated circuits having shallow junctions.

Isolation structures 14 are also preferably formed in the substrate 12. If the substrate 12 is formed of silicon, the isolation areas 14 are preferably formed of a silicon oxide, such as silicon dioxide, but may also be formed of silicon nitride or a combination of materials, or one or more of a number of other substantially electrically nonconductive materials. Further, shallow trench isolation structures are preferably employed for the isolation areas 14.

Resistor 18 has also preferably been formed on the substrate 12. Preferably, the resistor 18 is polysilicon and has vertical faces and a top surface. A gate 19 is also preferably formed, such as at the same time that the resistor 18 is formed. However, after formation of the resistor 18 and the gate 19, processing for the two structures may be different. For example, a silicide contact may be placed on the entire top surface of the gate 19, but silicide contacts might only be formed on contact areas of the resistor 18. In an alternate embodiment, both the resistor 18 and the structure referred to as the gate 19 are used as resistors in the integrated circuit 10.

Thus, the invention should not be limited by the specific embodiment as described below, or by the selection of the designated names for the structures 18 and 19 in the description below, which are selected primarily to enable convenient differentiation between the two structures. In addition, although the embodiment below is described in specific terms of forming a poly resistor 18, it is understood that the process flow suggested below is equally applicable to the formation of an island resistor. Thus, the invention is not to be unnecessarily restricted to the specific embodiment of a polysilicon resistor.

A protective layer 16 is formed on portions of the substrate 12. As shown in FIG. 1, the protective layer 16 is preferably formed on exposed portions of the substrate 12. Preferably the protective layer 16 covers at least the source and drain regions 15, and may also cover the isolation areas 14. The protective layer 16 is preferably an oxide and most preferably silicon dioxide.

In a preferred embodiment, an electrically nonconductive spacer 20 is also formed on the integrated circuit 10. Preferably, the electrically nonconductive spacer 20 comprises silicon nitride and is preferably formed on portions of the protective layer 16, such as on those portions of the protective layer 16 formed on the vertical faces of the resistors 18.

It is understood that the surface profile of the substrate 12 shown in the figures is exemplary, and the invention is not limited to the surface profile as shown, the number of layers shown, or the materials or devices specifically disclosed. Although the substrate 12 shown in FIG. 1 is at a particular point in the processing of the integrated circuit 10, the substrate 12 may comprise additional structures or layers not shown in the figures.

As shown in FIG. 1, a blocking layer 22 is deposited upon the substrate 12. In a preferred embodiment, the blocking layer 22 is amorphous silicon carbide. If the blocking layer 22 is amorphous silicon carbide, the blocking layer is preferably deposited by plasma enhanced chemical vapor deposition using an alkyl silane based precursor. Alternately, deposition of the blocking layer 22 uses an ozone assisted technique. The blocking layer 22 may also be formed or deposited by a number of other methods known by those skilled in the art. Preferably, the blocking layer 22 covers the substrate 12 including the exposed portions of the isolation areas 14, the resistor 18, the protective layer 16, and the electrically nonconductive spacer 20.

The blocking layer 22 is preferably formed of a material that is substantially different from the material of which the isolation structures 14 and the protective layer 16 are formed. As mentioned above, in the preferred embodiment where the substrate 12 is formed of silicon, the isolation structure 14 and the protective layer 16 are preferably formed of silicon oxide. Thus, the blocking layer 22 is most preferably not formed of silicon oxide, but instead is preferably formed of a material that can be etched using a process that etches the material of the blocking layer 22 at a much higher rate than the rate at which the etching process etches the material of the protective layer 16 and the isolation structure 14.

The etch selectively is preferred so that the blocking layer 22 can be relatively easily removed without substantially removing the protective layer 16. Then, the protective layer 16 can be relatively easily removed without removing a substantial amount of the isolation structure 14. If, however, the blocking layer 22 was formed of either the same material as the protective layer 16 and the isolation structure 14, or of a material that etched at substantially the same rate as the material of the protective layer 16 and the isolation structure 14, then when the blocking layer 22 was etched, portions of the protective layer 16 and the isolation structure 14 would also tend to be etched to differing degrees across the surface of the substrate 12.

In other words, slight differences in the thicknesses and etch rates of the protective layer 16 and the isolation structure 14 across the surface of the substrate 12 would tend to cause a non uniform degree of over etching of the isolation structures 14 at their interfaces with the substrate 12. This tends to increase the leakage current of a silicided submicron device, and thus is very undesirable. However, by forming the blocking layer 24 of a material that is etched with a process that does not substantially etch the protective layer 22 and the isolation structure 14, the blocking layer 24 can be completely removed from desired portions of the integrated circuit 10 without damaging either the protective layer 16 or the isolation structure 14. The relatively thin protective layer 16 can then be removed in a relatively quick process, which takes less time than a longer etch, and which is therefore more easily controlled, thus reducing any over etch and damage to the isolation structure 14.

In a preferred embodiment, the blocking layer 22 is preferably patterned by first forming a bottom antireflection coating 24 on the blocking layer 22. A patterning layer 26 is preferably formed on at least portions of the top surface of bottom antireflection coating 24. In a preferred embodiment, the patterning layer 26 comprises a photoresist material. If the patterning layer 26 comprises a photoresist material, the patterning layer 26 is exposed and developed according to conventional methods known in the art, thereby exposing portions of the bottom antireflection coating 24. The exposed portions of the bottom antireflection coating 24 correspond to underlying portions of the blocking layer 22 to be removed.

Figure 2:
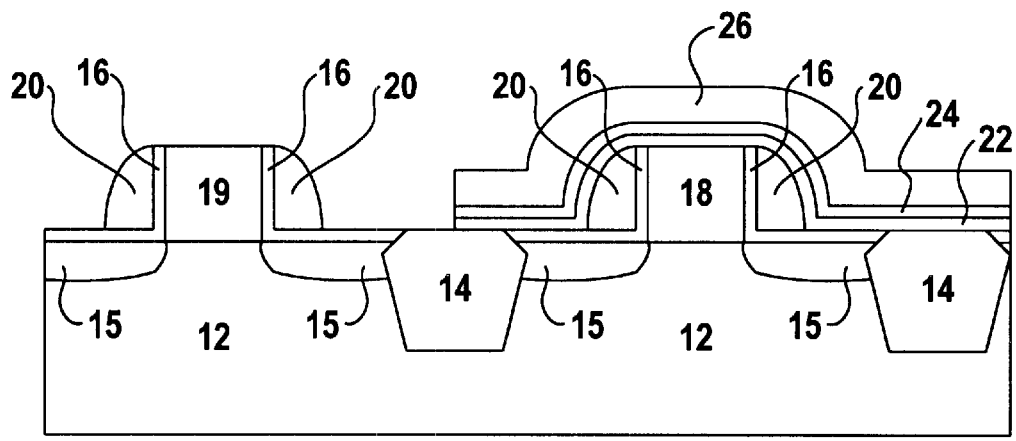
FIG. 2 is a cross sectional side view of the integrated circuit of FIG. 1, where portions of the blocking layer have been removed.

As shown in FIG. 2, the substrate 12 is then preferably etched to remove the exposed portions of the bottom antireflection coating 24 and the corresponding underlying portions of the blocking layer 22. In a preferred embodiment, the bottom antireflection coating 24 and the corresponding, underlying portions of the blocking layer 22 are plasma etched. Other etching processes may also be suitable for removal of the blocking layer 22, provided that the material of the protective layer 16 and isolation structure 14 is relatively resistant to the etch used.

Portions of the isolation areas 14 may be underneath the blocking layer 22. By protecting the isolation areas 14 from the etching of the blocking layer 22, the isolation areas 14 are additionally protected from the formation of recesses and the resulting junction leakage current.

The etching preferably ceases when the underlying portions of the blocking layer 22 have been substantially removed and portions of the protective layer 16 are exposed. Preferably, the endpoint of the etching process is optically determined when the protective layer 16 is exposed. Once the underlying portions of the blocking layer 22 are substantially removed, one or more of the top surfaces of the gate 19, the isolation areas 14, and the spacer 20 are exposed as shown in FIG. 2. The exposed portions of the protective layer 16 are then substantially removed. Preferably, the exposed portions of the protective layer 16 are removed by a light wet etch dip in hydrofluoric acid, thereby exposing portions of the substrate 12.

Figure 3:
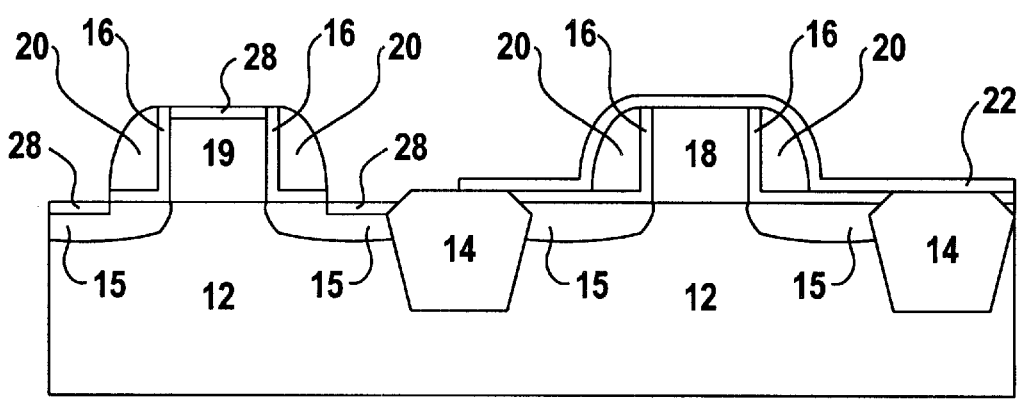
FIG. 3 is a cross sectional side view of the integrated circuit of FIG. 2, where a reacted metal layer has been formed in regions of the integrated circuit.

As depicted in FIG. 3, metal is preferably deposited and reacted with the exposed portions of the substrate 12 and the polysilicon gate 19 to form silicide contacts 28. The unreacted metal is then preferably stripped away. The metal is preferably deposited according to a process that is compatible with silicide formation and the materials, structures, and processes as described herein.

Figure 4:
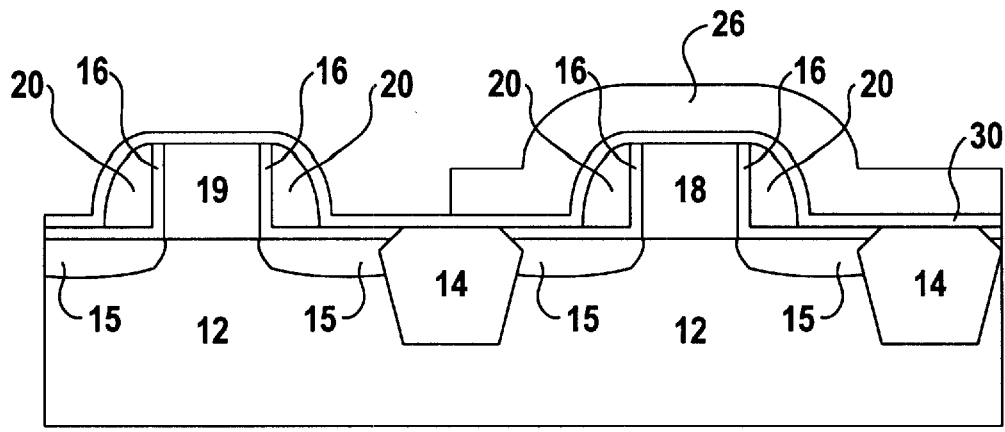
FIG. 4 is a cross sectional side view of an alternate patterned blocking layer.

In an alternate embodiment shown in FIG. 4, an alternate blocking layer 30 is deposited on the substrate 12. In the alternate embodiment, the blocking layer 30 is preferably amorphous silicon oxy carbide. If the alternate blocking layer 30 is amorphous silicon oxy carbide, the alternate blocking layer 30 is preferably deposited by plasma enhanced chemical vapor deposition utilizing an alkyl silane based precursor as the silicon source. Preferably, nitrous oxide or oxygen serve as the oxygen source. Alternately, deposition of the alternate blocking layer 30 utilizes an ozone assisted technique. The alternate blocking layer 30 may also be formed or deposited by other methods known and practiced by those skilled in the art. Preferably, the alternate blocking layer 30 covers the substrate 12 including at least the exposed portions of the isolation areas 14, the resistor 18, the protective layer 16, the gate 19, and the spacers 20.

In the alternate embodiment, the alternate blocking layer 30 preferably also comprises an antireflection coating layer. If the alternate blocking layer 30 is amorphous silicon oxy carbide, varying the carbon and oxygen content of the amorphous silicon oxy carbide yields different reflective indexes and different extinction coefficients for the alternate blocking layer 30. By selecting the carbon and oxygen content to yield the desired reflective index and extinction coefficient, the alternate blocking layer 30 preferably serves as an antireflection coating layer.

A patterning layer 26 is preferably formed on at least portions of the alternate blocking layer 30. The patterning layer 26 preferably comprises a photoresist material. If the patterning layer 26 comprises a photoresist material, the patterning layer 26 is exposed and developed, thereby exposing portions of the alternate blocking layer 30.

The substrate 12 is preferably etched to remove the exposed portions of the alternate blocking layer 30. In a preferred embodiment, the alternate blocking layer 30 is plasma etched. If the protective layer 16 is resistive to the etching process used, structures on the substrate 12 such as the protective layer 16 and the isolation structures 14 are protected from over etching. Other etching processes may also be suitable for removal of the alternate blocking layer 30, provided that the material of the protective layer 16 and the isolation structure 14 are resistive to the etch used.

Figure 5:
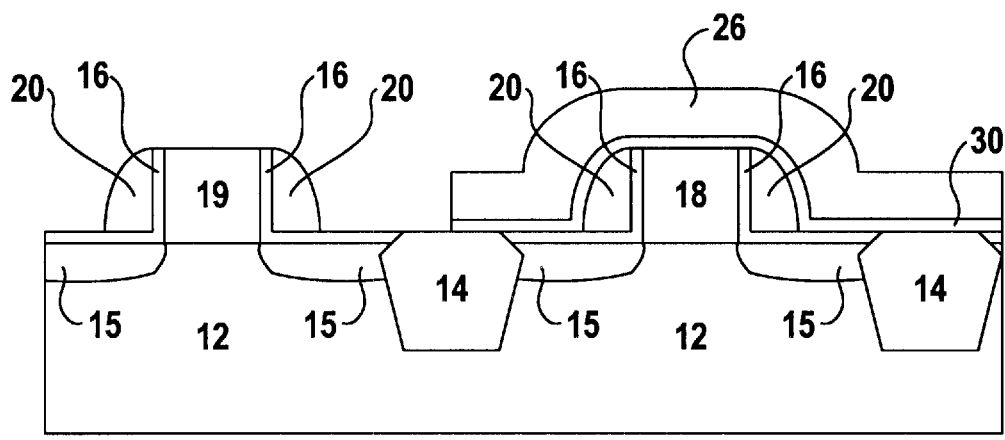
FIG. 5 is a cross sectional side view of the integrated circuit of FIG. 4, where portions of the blocking layer have been removed.

The etching preferably ceases when the exposed portions of the alternate blocking layer 30 are substantially removed and portions of the protective layer 16 are exposed. Preferably, the endpoint of the etching process is optically determined when the protective layer 16 is exposed. Once the exposed portions of the alternate blocking layer 30 are substantially removed, structures such as one or more of the top surfaces of the gate 19, the isolation areas 14, the protective layer 16, and the spacers 20 may be exposed as well. FIG. 5 depicts the substrate 12 of integrated circuit 10 after the alternate blocking layer 30 has been substantially removed.

Figure 6:
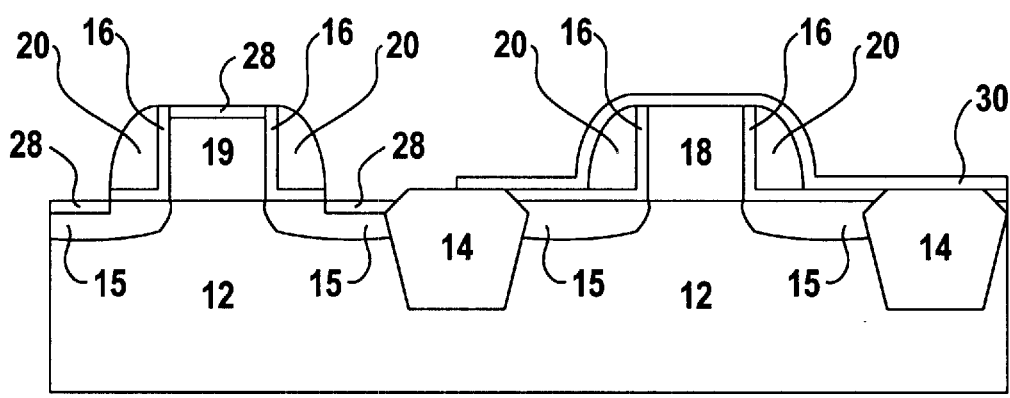
FIG. 6 is a cross sectional side view of the integrated circuit of FIG. 5, where a reacted metal layer has been formed in regions of the integrated circuit.

The exposed portions of the protective layer 16 are then substantially removed as shown in FIG. 6. Preferably, the exposed portions of the protective layer 16 are removed by a wet etch dip, thereby exposing portions of the substrate 12. If the substrate 12 is silicon, metal is preferably deposited upon the exposed portions of the substrate 12 to form silicide regions 28 in the substrate 12, as described above. Metal is also deposited on the exposed top surface of the gates 19 to form silicide regions 28. The metal is preferably deposited according to a process that is compatible with silicide formation and the other materials, processes, and structures described herein.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for blocking formation of a reacted metal layer on a structure in an integrated circuit having a source region a drain region, a gate, an isolation area formed of a material, and a protective layer formed of substantially the same material as the isolation area, the protective layer overlying at least the source region and the drain region, while reducing an amount of the material of the isolation area that is removed when the material of the protective layer is removed, the method comprising:

depositing a blocking layer on the integrated circuit, the blocking layer formed of a material that is substantially different from the material of the isolation area and the protective layer, patterning the blocking layer by depositing a bottom antireflection coating and a photoresist layer, exposing the photoresist layer, and developing the photoresist layer, to selectively cover portions of the blocking layer that overlie at least the structure and selectively expose portions of the blocking layer that overlie at least the source region, the drain region, and the gate, etching the exposed portions of the blocking layer with an etchant to substantially remove the exposed portions of the blocking layer and to expose portions of the protective layer, wherein the etchant etches the blocking layer at a substantially greater rate than the protective layer, etching the exposed portions of the protective layer for a period of time that is just sufficient to remove the exposed portions of the protective layer, but not sufficient to substantially remove any of the material of the isolation area, thereby exposing portions of the integrated circuit, including at least the source region, the drain region, and the gate, depositing metal on the exposed portions of the integrated circuit, reacting the metal with at least the source region, the drain region, and the gate to form the reacted metal layer, and removing unreacted metal from other exposed portions of the integrated circuit and the blocking layer.

2. The method of claim 1 wherein the integrated circuit is formed in a silicon substrate.

3. The method of claim 1 wherein the protective layer is substantially silicon dioxide.

4. The method of claim 1 wherein the step of depositing the blocking layer comprises plasma enhanced chemical vapor deposition using an alkyl silane base precursor.

5. The method of claim 1 wherein the blocking layer is silicon carbide.

6. The method of claim 1 wherein the isolation area is covered with the blocking layer.

7. The method of claim 1 wherein the step of etching the blocking layer comprises a plasma etch.

8. The method of claim 1 wherein the step of etching the protective layer comprises a wet etch using hydrofluoric acid.

9. A method for blocking formation of a reacted metal layer on a structure in an integrated circuit having a source region, a drain region, a gate, an isolation area formed of a material, and a protective layer formed of substantially the same material as the isolation area, the protective layer overlying at least the source region and the drain region, while reducing an amount of the material of the isolation area that is removed when the material of the protective layer is removed, the method comprising:

depositing a blocking layer on the integrated circuit, the blocking layer formed of silicon oxy carbide, patterning the blocking layer to selectively cover portions of the blocking layer that overlie at least the structure and selectively expose portions of the blocking layer that overlie at least the source region, the drain region, and the gate, etching the exposed portions of the blocking layer with an etchant to substantially remove the exposed portions of the blocking layer and to expose portions of the protective layer, wherein the etchant etches the blocking layer at a substantially greater rate than the protective layer, etching the exposed portions of the protective layer for a period of time that is just sufficient to remove the exposed portions of the protective layer, but not sufficient to substantially remove any of the material of the isolation area, thereby exposing portions of the integrated circuit, including at least the source region, the drain region, and the gate, depositing metal on the exposed portions of the integrated circuit, reacting the metal with at least the source region, the drain region, and the gate to form the reacted metal layer, and removing unreacted metal from other exposed portions of the integrated circuit and the blocking layer.

10. The method of claim 9 wherein the substrate is silicon and the protective layer is silicon oxide.

11. The method of claim 9 wherein the step of etching the protective layer comprises a wet etch using hydrofluoric acid.

12. The method of claim 9 wherein the step of etching the blocking layer comprises a plasma etch.

13. A method for blocking formation of a reacted metal layer on a structure in an integrated circuit having a source region, a drain region, a gate, an isolation area formed of a material, and a protective layer formed of substantially the same material as the isolation area, the protective layer overlying at least the source region and the drain region, while reducing an amount of the material of the isolation area that is removed when the material of the protective layer is removed, the method comprising :

depositing a blocking layer of amorphous silicon oxy carbide on the integrated circuit, the blocking layer formed of a material that is substantially different from the material of the isolation area and the protective layer, patterning the blocking layer to selectively cover portions of the blocking layer that overlie at least the structure and selectively expose portions of the blocking layer that overlie at least the source region, the drain region, and the gate, etching the exposed portions of the blocking layer with an etchant to substantially remove the exposed portions of the blocking layer and to expose portions of the protective layer, wherein the etchant etches the blocking layer at a substantially greater rate than the protective layer, etching the exposed portions of the protective layer for a period of time that is just sufficient to remove the exposed portions of the protective layer, but not sufficient to substantially remove any of the material of the isolation area, thereby exposing portions of the integrated circuit, including at least the source region, the drain region, and the gate, depositing metal on the exposed portions of the integrated circuit, reacting the metal with at least the source region, the drain region, and the gate to form the reacted metal layer, and removing unreacted metal from other exposed portions of the integrated circuit and the blocking layer.

14. The method of claim 13 wherein the step of patterning the blocking layer further comprises depositing a photoresist layer exposing the photoresist layer, and developing the photoresist layer.

15. The method of claim 13 wherein the blocking layer also functions as an antireflection coating layer.

* * * * *